US007016452B2

(12) United States Patent
Partsch et al.

(10) Patent No.: US 7,016,452 B2
(45) Date of Patent: Mar. 21, 2006

(54) DELAY LOCKED LOOP

(75) Inventors: Torsten Partsch, Chapel Hill, NC (US); Thomas Hein, München (DE); Thilo Marx, Villingen-Schwenningen (DE); Patrick Heyne, München (DE)

(73) Assignee: Infineon Technologies AG, Munich (DE)

(*) Notice: Subject to any disclaimer, the term of this patent is extended or adjusted under 35 U.S.C. 154(b) by 770 days.

(21) Appl. No.: 10/178,249

(22) Filed: Jun. 24, 2002

(65) Prior Publication Data

US 2003/0012322 A1 Jan. 16, 2003

(30) Foreign Application Priority Data

Jun. 22, 2001 (DE) ................................ 101 30 122

(51) Int. Cl.
*H03D 3/24* (2006.01)

(52) U.S. Cl. ....................... 375/376; 375/374; 375/375

(58) Field of Classification Search ................ 375/376, 375/374, 375, 327, 294
See application file for complete search history.

(56) References Cited

U.S. PATENT DOCUMENTS

| | | | | |
|---|---|---|---|---|
| 6,232,812 | B1 * | 5/2001 | Lee | 327/277 |
| 6,292,116 | B1 * | 9/2001 | Wang et al. | 341/100 |
| 6,639,956 | B1 * | 10/2003 | Song | 375/354 |
| 6,727,738 | B1 * | 4/2004 | Tsukikawa | 327/160 |
| 2002/0027964 | A1 * | 3/2002 | Yoo et al. | 375/341 |

FOREIGN PATENT DOCUMENTS

| | | |
|---|---|---|
| DE | 195 33 414 C1 | 1/1997 |
| DE | 197 01 937 A1 | 7/1997 |
| WO | WO 98/37656 | 8/1998 |

* cited by examiner

*Primary Examiner*—Jay K. Patel
*Assistant Examiner*—Qutub Ghulamali
(74) *Attorney, Agent, or Firm*—Laurence A. Greenberg; Werner H. Stemer; Ralph E. Locher

(57) ABSTRACT

A delay locked loop includes a delay unit with a controllable delay time. Switching elements are provided in order to tap off output signals from the delay elements of the delay unit. Two nodes connected to the switching elements are connected to a multiplexer configuration in order to activate in each case two of the switching elements that are connected to delay elements connected directly in succession. A phase interpolator generates an intermediate phase from the signals provided.

7 Claims, 3 Drawing Sheets

DELAY LOCKED LOOP

BACKGROUND OF THE INVENTION

Field of the Invention

The invention relates to a delay locked loop having a delay unit with a controllable delay time and a control loop having feedback to the delay unit. The control loop is for controlling the delay time.

Delay locked loops are used in circuits that operate digitally in order to generate clock signals with a predetermined phase angle. By way of example, in synchronously operated integrated semiconductor memories, so-called SDRAMs (Synchronous dynamic random access memories), a delay loop is used to generate a clock signal while taking account of internal signal propagation times. This clock signal provides data that will be output synchronously with an input clock signal that is fed to the integrated circuit at a different location.

For this purpose, in the delay locked loop, a phase detector is used to compare the clock signal that is fed to the input of the delay unit with the clock signal that is output by the delay unit. The feedback loop additionally contains a fixed delay time that represents the downstream signal propagation times. A loop filter, for example, embodied in a manner based on a counter, controls the delay time of the delay unit. The control loop adjusts the delay time to such an extent that the phase difference at the phase detector is corrected as far as possible to zero. The delay unit contains a multiplicity of cascaded delay elements that are each connected to a switch that can be driven by a counter in order to switch the output signal of the respective delay element through to the output of the delay unit. The number of delay elements that are activated between the input and the output of the delay unit determines the instantaneous delay time.

In practice, it has become necessary to make the step size of the delay time as small as possible, in particular, smaller than the delay time brought about by a delay element of the delay unit. For this purpose, a phase interpolator has an input connected to the switches branching away from the delay elements. The output of the phase interpolator is connected to the output terminal of the delay unit. The output signals of the delay elements that are connected in series, directly in succession, are fed to the phase interpolator in each case in a manner dependent on how the counter of the loop filter sets the switches. The phase interpolator thereupon generates, in a manner dependent on a selection signal, a phase lying between these signals. This makes it possible for the delay unit to generate phase increments that are smaller than the delay time brought about by a delay element.

It is important that the phase difference of the signals that are fed to the input of the phase interpolator is equal to a phase difference or a delay time that is brought about along a delay element. Only in this way can it be ensured that, in the event of a readjustment of the delay time, that is to say if the inputs of the phase interpolator that have hitherto been connected to the outputs of one pair of delay elements are then connected to the next or the preceding pair of delay elements, no sudden phase change is introduced at the output of the phase interpolator. The output signal of the delay unit then has, as far as possible, a linear transfer response depending on the control signal.

SUMMARY OF THE INVENTION

It is accordingly an object of the invention to provide a delay locked loop which overcomes the above-mentioned disadvantages of the prior art apparatus of this general type.

One object of the invention is to provide a delay locked loop having a linear control response that is free of sudden phase changes, as much as possible.

With the foregoing and other objects in view there is provided, in accordance with the invention, a delay locked loop, including: a delay unit having a terminal for receiving a clock signal that will be delayed, a terminal for providing a delayed clock signal obtained by delaying the clock signal by a delay time, and a control terminal for receiving a control signal that controls the delay time. The delay locked loop also includes a feedback loop connecting the terminal for providing the delayed clock signal back to the control terminal of the delay unit; and a phase interpolator having a first terminal for receiving a first input signal and a second terminal for receiving a second input signal. The delay unit includes series-connected delay elements having output terminals. Each one of the delay elements provides a delay time. The delay unit includes a plurality of switching elements controlled by control signals. Each one of the plurality of the switching elements is connected to a respective one of the delay elements. The delay unit includes a switching device having a first input, a second input, and two outputs. The first input is connected to a first portion of the plurality of the switches. The second input is connected to a second portion of the plurality of the switches. The switching device is for connecting the two outputs of the switching device to the output terminals of two of the delay elements being connected directly in succession. The switching device includes two multiplexers having inputs being coupled together. Each one of the two multiplexers has an output defining a respective one of the two outputs of the switching device. The phase interpolator is connected downstream of the two outputs of the switching device. In a manner dependent on a selection signal, the phase interpolator effects a shift in a phase of the first input signal or the second terminal by a subphase that is smaller than the delay time of one of the delay elements.

In accordance with an added feature of the invention, each one of the two multiplexers have a control terminal for receiving a control signal; and the control terminal of one of the two multiplexers is driven complementary with respect to the control terminal of another one of the two multiplexers.

In accordance with an additional feature of the invention, the plurality of the switching elements connect the first input and the second input of the switching device to the output terminals of the delay elements. An odd number of the delay elements are connected in series between ones of the delay elements that are connected to the first input of the switching device. An odd number of the delay elements are connected in series between ones of the delay elements that are connected to the second input of the switching device.

In accordance with another feature of the invention, the plurality of the switching elements are tristate gates that can be controlled by the control signal that controls the delay time.

In accordance with a further feature of the invention, the switching device includes tristate gates having inputs coupled in pairs and outputs cross-coupled in pairs.

In accordance with a further added feature of the invention, there is provided, a counter for incrementing. Each one of the two multiplexers of the switching device has a control terminal for receiving a control signal. Each one of the two multiplexers has a switching state that is changed in response to the incrementing of the counter.

In accordance with a another added feature of the invention, there is provided, a decoder. The feedback loop includes a counter. The decoder is connected downstream of the counter for placing two of the plurality of the switching elements into an on state and for placing remaining ones of the plurality of the switching elements into an off state.

In the case of the inventive delay locked loop, the delay unit has a linear control response. If the control signal that sets the delay time changes, the change follows the delay time linearly. In particular when the inputs of a phase interpolator are connected to a succeeding or preceding pair of delay elements in the delay unit, it is ensured that no sudden phase change is generated as a result of this changeover operation. In the SDRAM application, the synchronism of the output data to be output can thus be set relatively finely, and without phase jitter, to the clock signal fed to the input.

The invention uses a multiplexer configuration including two multiplexers in order to connect the two inputs of the phase interpolator, in each case, to the outputs of delay elements of the delay unit that are connected in series directly in succession. For this purpose, the inputs of the multiplexers are connected, via respective switching elements, to outputs of delay elements. An odd number of other delay elements in each case is connected between these delay elements. Considered from a different viewpoint, an even number of other delay elements is in each case active between the outputs of delay elements that are connected to the respective inputs of the multiplexers via the switching elements. The switching elements connected between the inputs of the multiplexers and the outputs of the delay elements are, in each case, controlled in such a way that signals delayed in each case by a delay element are fed to the inputs of the multiplexers. The phase interpolator that is connected downstream of the multiplexer can generate an intermediate phase angle from them.

The switching elements that connect the inputs of the multiplexers to the outputs of the delay elements and additionally the signal paths in the multiplexer themselves contain respective tristate gates. The tristate gates are either switched in a high-impedance manner or forward the pulse on the input side in inverted form.

The loop filter contains a counter, downstream of which is connected a decoder. The decoder generates the corresponding control signals in order to turn on, in each case, two switching elements connected to the outputs of the delay elements that are connected directly in series, while the remaining switching elements are switched in a high-impedance manner. The inputs and outputs of the multiplexers are connected in parallel relative to the signal paths. The control of the multiplexers is complementarily driven. The control signal of the multiplexers is changed over with each counting clock of the counter. The control input of the multiplexers is therefore connected to the least significant bit of the counter. Finally, the decoder that is connected downstream of the counter generates the selection signal for the intermediate phase angle to be tapped off by the phase interpolator.

Other features which are considered as characteristic for the invention are set forth in the appended claims.

Although the invention is illustrated and described herein as embodied in delay locked loop, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 5:
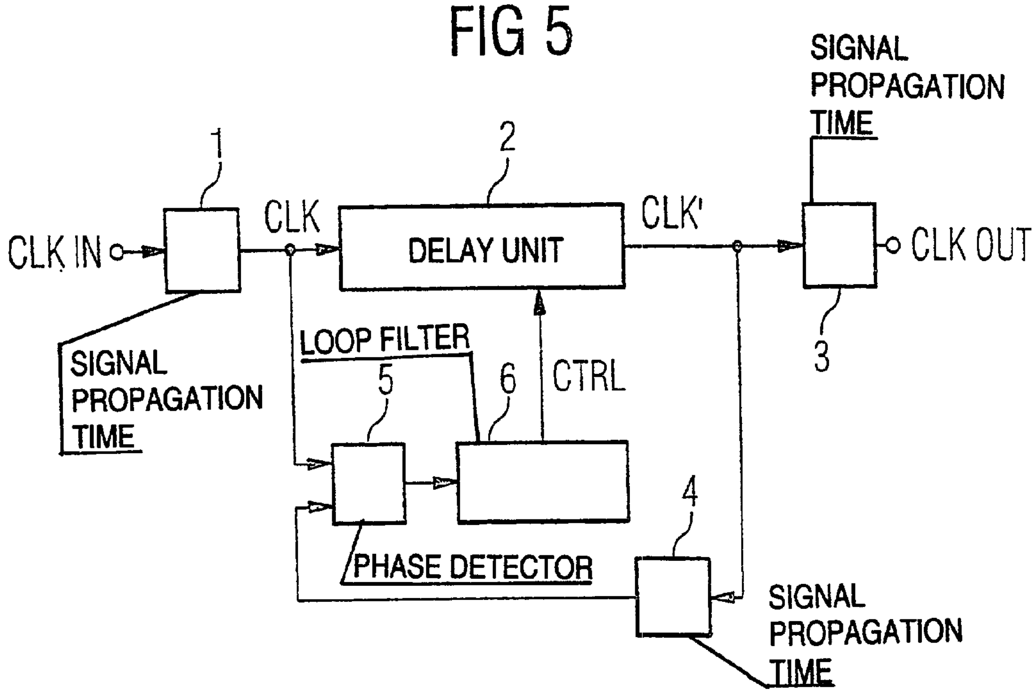
FIG. 5 is a block diagram of a delay locked loop in which the delay unit of FIG. 1 can be employed.

Referring now to the figures of the drawing in detail and first, particularly, to FIG. 5 thereof, there is shown a delay locked loop. A clock signal CLKIN is fed to the input of the delay locked loop, for example, at an input terminal of the integrated semiconductor-circuit. The circuit block 1 represents the signal propagation time that is present until the input a delay unit 2 with a controllable delay time. The delay unit 2 delays the clock signal CLK fed to the input thereof in accordance with a control signal CTRL and generates a delayed clock signal CLK' from the clock signal CLK. Finally, the circuit block 3 represents the signal propagation time that is effective on the output. This signal propagation time includes the signal propagation time through the drivers that are driven by the clock signal CLKOUT. The clock signal CLKOUT is present at the output of the block 3. The delay locked loop has a feedback loop that leads the output of the delay unit 2, via a circuit block 4, to a phase detector 5. The circuit block 4 simulates the signal propagation time that is effective in the block 3. The phase detector 5 compares the phase angles of the fed-back signal with the clock signal CLK fed to the input of the delay unit 2. A loop filter 6 is controlled in a manner dependent on this. This loop filter 6 has an output providing the control signal CTRL. The control loop readjusts the delay time of the delay unit 2 to such an extent that the phase difference of the signals fed to the inputs of the phase detector 5 becomes as close to zero as possible. The delay locked loop has the overall effect that a switching element controlled by the output clock CLKOUT provides data clock-synchronously with the input clock CLKIN. The delay locked loop is employed, for example, in a microprocessor or in an SDRAM. In an SDRAM, the clock signal CLKIN is fed in to the input. The output signal CLKOUT finally controls an output driver for data values that will be read from the SDRAM, so that the data values are present, in a manner controlled by the clock signal CLKOUT that is clock-synchronous with the clock signal CLKIN fed in to the input. The more finely that the step size of the clock signal CLKOUT on the output can be controlled, the more easily the correct functionality and the required specifications can be complied with.

Figure 1:
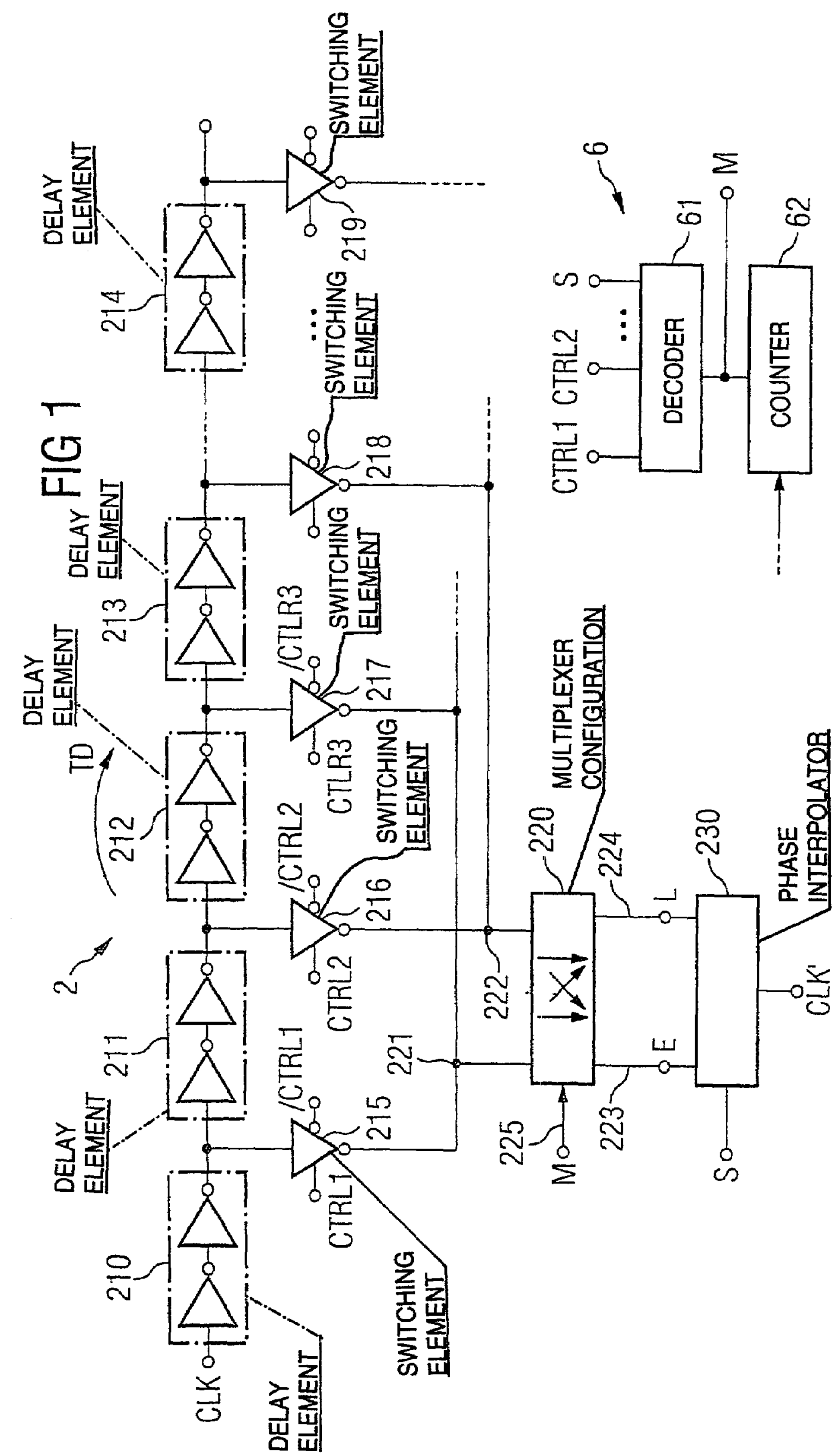
FIG. 1 is a block diagram of a delay unit for application in a delay locked loop.

The delay unit 2 is illustrated in detail in FIG. 1. The delay unit 2 has a multiplicity of series-connected delay elements 210, 211, 212, 213, 214. Each of the delay elements is constructed identically. By way of example, the delay element 210 contains two inverters that are directly cascaded in series. Respective switching elements 215, 216, 217, 218 and 219 are connected to the outputs of the inverters 210, . . . , 214. The switching elements 215, . . . , 219 can be driven by the loop filter 6. The loop filter 6 contains, inter alia, a counter 62 which is counted up or down depending on the phase error signal supplied by the phase detector 5. Connected downstream of the counter 62 is a decoder 61 which generates respective control signals CTRL1, CTRL2, . . . which in each case turn on adjacent switching elements 215, 216, . . . 219. In each case two of the switching elements are turned on; the rest are switched in a high-impedance manner. Consequently, the outputs of in each case two cascaded delay elements are tapped off from the series circuit of the delay elements 210, . . . , 214.

The outputs of the switching elements 215, 217, etc. are connected to a first circuit node 221 and the outputs of the switching elements 216, 218, etc. are connected to a second circuit node 222. The switching elements 215, 217, etc. connect the output of a respective delay element to the circuit node 221 and the switching elements 216, 218, etc. connect the output of a respective delay element to the circuit node 222. An odd number of delay elements are always connected between the delay elements that can be connected to a respective one of the circuit nodes 221 or 222. Thus, by way of example, the outputs of the delay elements 210, 212 can be connected to the circuit node 221 via the switching elements 215, 217; exactly a single delay element 211 is connected between the delay elements 210, 212. A further switching element (not illustrated) that is connected to the node 221 is connected to the outputs of the delay elements between which the three delay elements 211, 212, 213 are connected. This principle can be continued for further delay elements and applies correspondingly to the circuit node 222.

The decoder 61 generates, in a manner dependent on the counter 62, respective control signals in such a way that the output signals of directly cascaded delay elements 210, . . . , 214 are fed to the circuit nodes 221, 222. By way of example, the control signals CTRL1, CTRL2 are activated by the decoder 61, so that the switching elements 215, 216 are turned on and the output signals of the delay elements 210, 211 are applied to the circuit nodes 221, 222. In a next counting step of the counter 62, the output signals CTRL2, CTRL3 are activated by the decoder 61, so that the switching elements 216, 217 are turned on and the output signals of the delay elements 211, 212 are applied to the circuit nodes 221, 222. Therefore, the output signals of two delay elements that are connected in series directly in a cascaded manner are in each case present at the circuit nodes 221, 222.

Figure 2:
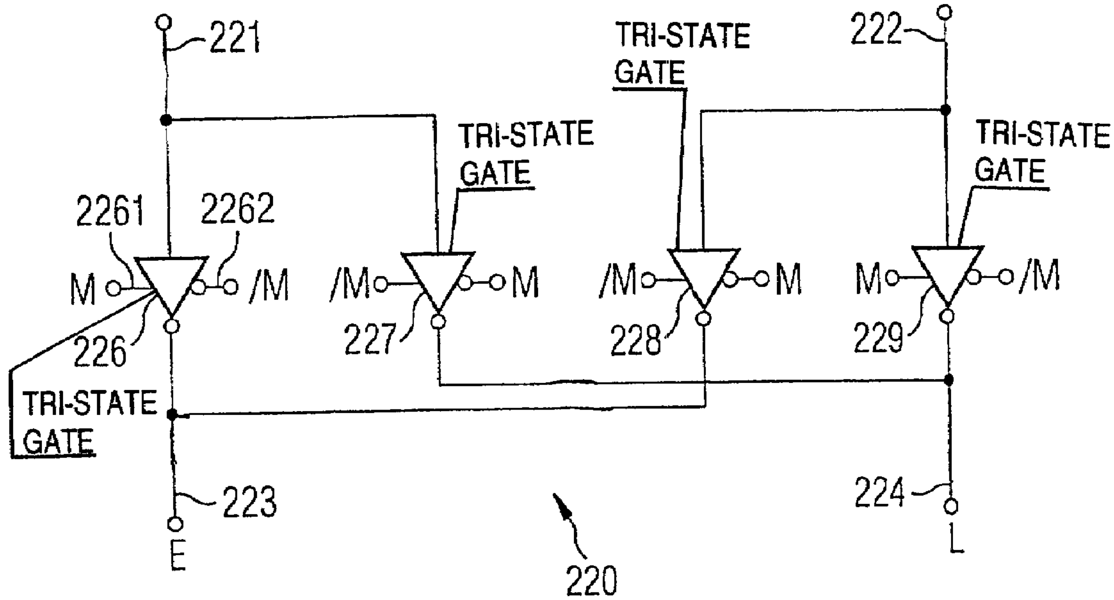
FIG. 2 is a circuit diagram of the multiplexer configuration that is in the delay unit shown in FIG. 1.

The circuit nodes 221, 222 form the inputs of a multiplexer configuration 220. The multiplexer configuration 220 is illustrated in detail in FIG. 2. A first multiplexer connects either the node 221 or the node 222 to the output-side node 223 in a manner dependent on a control signal M and the complement /M thereof. A further multiplexer connects the circuit node 222 or the node 221 to the output-side node 224. The second multiplexer can be driven complementarily with respect to the first multiplexer, that is to say by the signal /M and M. The first multiplexer contains the tristate gates 226, 228. The second multiplexer contains the tristate gates 227, 229. The inputs of the multiplexers are coupled. The two respective inputs of the multiplexers are connected to one another in pairs. The respective outputs 223, 224 of the multiplexers remain as separate terminals. The respective signal paths contain tristate gates in order to activate one of the signal paths and to disconnect the other signal path. Thus the tristate gate 226 connects the node 221 to the node 223, the tristate gate 227 connects the node 221 to the node 224, the tristate gate 228 connects the node 222 to the node 223, and the tristate gate 229 connects the node 222 to the node 224. The tristate gates 228, 229 are driven complementarily by control signal pair M and /M compared with the gates 226, 227.

Figure 4:
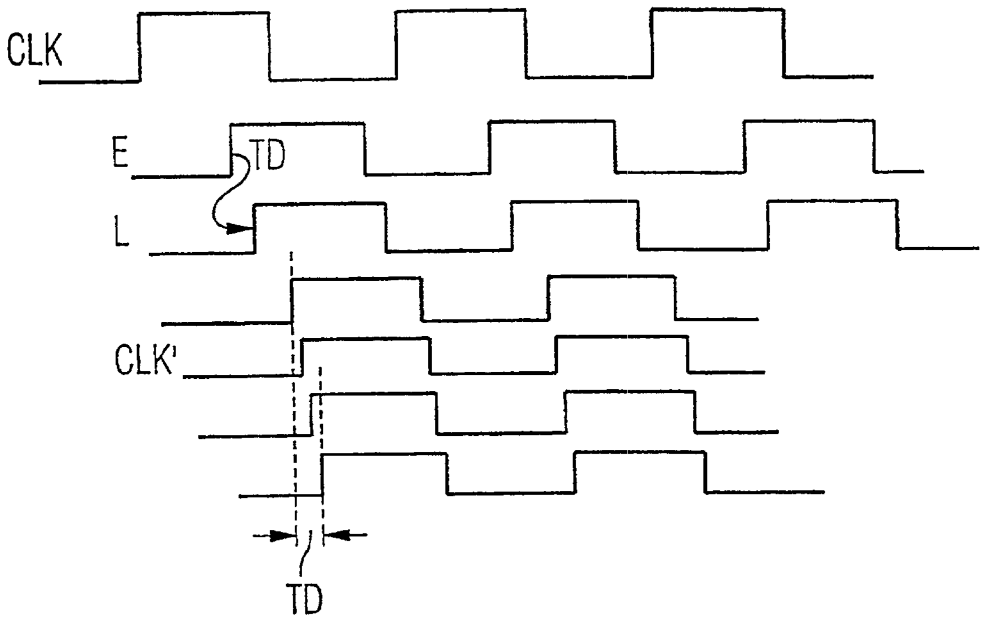
FIG. 4 shows a signal diagram of signals illustrated in FIG. 1.

Signals E and L are respectively present at the nodes 223, 224, which signals are fed to a phase interpolator 230 (FIG. 1). The phase interpolator 230 selects, in a manner dependent on a control signal S, a further delay time which is dimensioned to be so short that the output signal CLK' has a phase lying between the signals E and L. The selection signal S is likewise generated by the decoder 61. The decoder 61 consequently selects a coarse phase which can be tapped off from the delay elements 210, . . . , 214 and is fed to the circuit nodes 221, 222. The multiplexer configuration 220 ensures that, at the output terminals 223, 224 thereof, the respective earlier-phase signal E is ready at the terminal 223 and the later-phase signal L is ready at the terminal 224. Under the control of the selection signal S, the phase interpolator 230 selects a fine phase lying between the phase angles of the signals E and L. At the signals illustrated by way of example in FIG. 4, the signals E and L are generated at the terminals 223, 224 by the tristate gates 216, 217 being activated and all the other tristate gates 215, 218, 219 being switched off. The multiplexer configuration 220 connects the node 222 to the node 223, and the node 221 to the node 224. The delay time TD which is effective between input and output of the delay element 212 lies between edges of the signals E and L. Under the control of the selection signal S, the phase interpolator 230 selects one of the four intermediate phases CLK' illustrated. The earliest possible phase angle of the signal CLK' and the latest possible phase angle have at most a phase difference of the delay time TD.

It is assumed, then, for the further operation of the delay locked loop that the phase detector 5 detects a phase error which makes it necessary to increase the delay time of the delay unit 2. For this purpose, the counter 62 is incremented by a step size. The decoder 61 then switches the tristate gate 216 off and activates the tristate gate 218. As a result, the output signals of the delay elements 212 and 213 are switched to the nodes 221 and 222, respectively. The earlier-phase tapping is now present at the node 221, and the later-phase tapping is present at the node 222. The multiplexer configuration 220 is controlled in such a way that the node 221 is connected to the node 223 and the node 222 is connected to the node 224. Consequently, the multiplexer configuration 220 changes over with each counting step of the counter 62. The control terminal 225, which controls the setting of the multiplexer configuration 220, is connected to the least significant bit of the counter 62.

The circuit illustrated in FIG. 1 ensures that in the event of incrementing the counter 62 and in the event of advancing the tapping from the series circuit of delay elements, e.g. from the delay element 212 to the delay element 213, the signal previously present at the node 224 is changed over to the node 223. The end point of the phase interpolation by the phase interpolator 230 before a counting step of the counter 62 is therefore identical to the starting point of the phase interpolation in the next counting step. The circuit in accordance with FIG. 1 affords the possibility of tapping off the signals E and L directly from the outputs of the delay elements.

Figure 3:
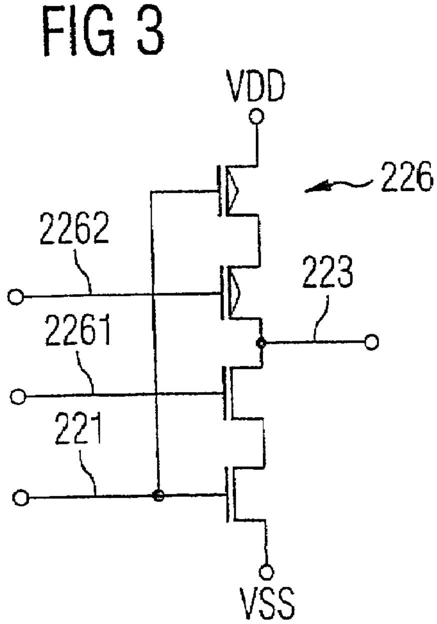
FIG. 3 is a transistor circuit diagram of a tristate gate.

One embodiment of a tristate gate is shown in FIG. 3. All of the tristate gates 215, . . . , 219 and 226, . . . , 229 are constructed accordingly. FIG. 3 shows the tristate gate 226 in its circuit environment. It contains two p-channel MOS transistors which are connected in series by the drain source paths and are connected to the positive supply voltage VDD. The p-channel transistors are connected to the reference-ground potential VSS via two n-channel MOS transistors which are connected in series by their drain-source paths. The transistors that are directly connected to the supply potentials are driven by applying the signal from node 221 to their gates. The output 223 of the tristate gate 226 is connected to the coupling node of p-channel and n-channel transistors. The inner p-channel transistor forms the inverted input 2262 of the tristate gate and is driven by the signal /M. The inner n-channel transistor forms the non-inverted control input 2261 of the tristate gate and is driven by the control signal M.

The function of the circuit illustrated in FIG. 1 can be summarized depending on the counting steps of the counter 62 using the table presented below. A row of the table specifies, for the respective counting step, which of the tristate gates 215, . . . , 219 are turned on. The remaining tristate gates are switched in a high-impedance manner. Moreover, the table specifies what signal state the control signal M has in order to control the multiplexer configuration 220.

| Counting step of the counter 62 | Active tristate gates | Control signal M |
|---|---|---|
| 0 | 215, 216 | 0 |
| 1 | 216, 217 | 1 |
| 2 | 217, 218 | 0 |
| 3 | 218, . . . | 1 |
| . . . | . . . | 0 |

We claim:

1. A delay locked loop, comprising:

a delay unit having a terminal for receiving a clock signal that will be delayed, a terminal for providing a delayed clock signal obtained by delaying the clock signal by a delay time, and a control terminal for receiving a control signal that controls the delay time;

a feedback loop connecting said terminal for providing the delayed clock signal back to said control terminal of said delay unit;

a phase interpolator having a first terminal for receiving a first input signal and a second terminal for receiving a second input signal;

said delay unit including series-connected delay elements having output terminals, each one of said delay elements providing a delay time;

said delay unit including a plurality of switching elements controlled by control signals, each one of said plurality of said switching elements being connected to a respective one of said delay elements;

said delay unit including a switching device having a first input, a second input, and two outputs;

said first input being connected to a first portion of said plurality of said switches;

said second input being connected to a second portion of said plurality of said switches;

said switching device for connecting said two outputs of said switching device to said output terminals of two of said delay elements being connected directly in succession;

said switching device including two multiplexers having inputs being coupled together, each one of said two multiplexers having an output defining a respective one of said two outputs of said switching device;

said phase interpolator being connected downstream of said two outputs of said switching device; and in a manner dependent on a selection signal, said phase interpolator effecting a shift in a phase of an input signal, selected from the group consisting of the first input signal and the second input signal, by a subphase that is smaller than the delay time of one of said delay elements.

2. The delay locked loop according to claim 1, wherein:

each one of said two multiplexers have a control terminal for receiving a control signal; and said control terminal of one of said two multiplexers being driven complementary with respect to said control terminal of another one of said two multiplexers.

3. The delay locked loop according to claim 1, wherein:

said plurality of said switching elements connect said first input and said second input of said switching device to said output terminals of said delay elements;

an odd number of said delay elements are connected in series between ones of said delay elements connected to said first input of said switching device; and an odd number of said delay elements are connected in series between ones of said delay elements connected to said second input of said switching device.

4. The delay locked loop according to claim 1, wherein:

said plurality of said switching elements are tristate gates that can be controlled by the control signal that controls the delay time.

5. The delay locked loop according to claim 4, wherein:

said switching device includes tristate gates having inputs coupled in pairs and outputs cross-coupled in pairs.

6. The delay locked loop according to claim 5, comprising:

a counter for incrementing;

each one of said two multiplexers of said switching device having a control terminal for receiving a control signal; and each one of said two multiplexers having a switching state being changed in response to the incrementing of said counter.

7. The delay locked loop according to claim 1, comprising:

a decoder;

the feedback loop including a counter; and said decoder connected downstream of said counter for placing two of said plurality of said switching elements into an on state and for placing remaining ones of said plurality of said switching elements into an off state.

* * * * *